United States Patent [19]

Burlion et al.

[11] Patent Number: 5,279,534
[45] Date of Patent: Jan. 18, 1994

[54] ROLLER FOR SUPPORTING OR DRIVING FLAT PRODUCTS, IN PARTICULAR FOR A CONTINUOUS TREATING INSTALLATION

[75] Inventors: Robert Burlion, Thionville; Christian Deutsch, Metz; Jean-Paul Schmit, Hagondange, all of France

[73] Assignee: Sollac, a French body corporate, Puteaux, France

[21] Appl. No.: 911,085

[22] Filed: Jul. 9, 1992

[30] Foreign Application Priority Data

Jul. 10, 1991 [FR] France ............... 91 08699

[51] Int. Cl.⁵ ..................... B21B 1/08; B21B 27/02
[52] U.S. Cl. ......................... 492/11; 492/15; 165/11.1; 432/32
[58] Field of Search ............ 29/110, 112, 123; 165/40, 90, 11.1; 432/236, 32, 44, 48, 246; 492/9, 10, 11, 15, 47

[56] References Cited

U.S. PATENT DOCUMENTS

| | | | |
|---|---|---|---|
| 1,820,985 | 9/1931 | McKee | 29/115 X |
| 3,183,718 | 5/1965 | Schneidler | 432/32 X |
| 3,824,857 | 7/1974 | Smith | . |
| 4,826,540 | 5/1989 | Mele | . |
| 4,965,920 | 10/1990 | Smith | 29/112 |

FOREIGN PATENT DOCUMENTS

| | | |
|---|---|---|
| 0135250 | 3/1985 | European Pat. Off. . |
| 2621120 | 3/1989 | France . |
| 0121050 | 6/1985 | Japan ............... 29/112 |
| 0513220 | 3/1939 | United Kingdom ............... 29/123 |

OTHER PUBLICATIONS

Patent Abstracts of Japan, vol. 015037, (P-1159)(15037), Jan. 29, 1991, & JP-A-89-095 414, Nov. 9, 1990, Masuno Yasuhiko, et al., "Temperature Measuring Method For Metal Strip And Temperature Measuring Roll For Metal Strip."
Patent Abstracts of Japan, vol. 005073, (P-061)(5073), May 15, 1981, & JP-A-790 096 992, Jul. 30, 1979, Akama Kazuo, "Continuously Measuring Apparatus for Temperature of Moving Strip."

*Primary Examiner*—Timothy V. Eley
*Attorney, Agent, or Firm*—Oblon, Spivak, McClelland, Maier & Neustadt

[57] ABSTRACT

A roller is provided with at least one thermocouple for measuring the temperature of a product or sheet. The roller comprises a hollow cylindrical body whose outer surface cooperates by contact with the sheet. The thermocouple removably extends through a guide tube which extends inside the roller and is carried by supports. The end of the guide tube through which the hot junction of the thermocouple extends is fixed in a position perpendicular to the wall of cylindrical body. This end of the guide tube opens onto a blind hole provided in the wall of the cylindrical body where the hot junction of the thermocouple is received. Application in the measurement of the temperature of the sheet of an annealing furnace of a continuous treatment process.

6 Claims, 4 Drawing Sheets

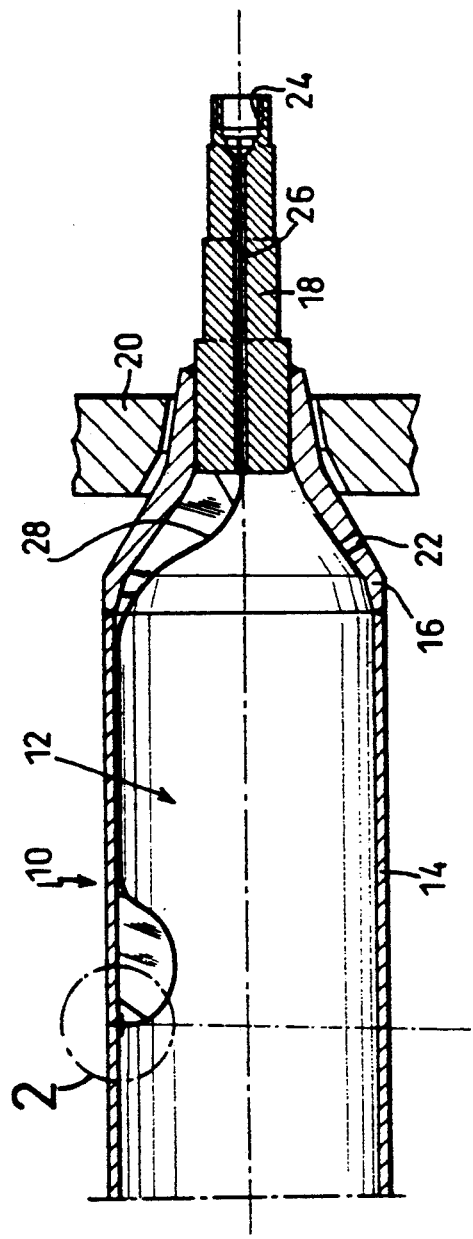
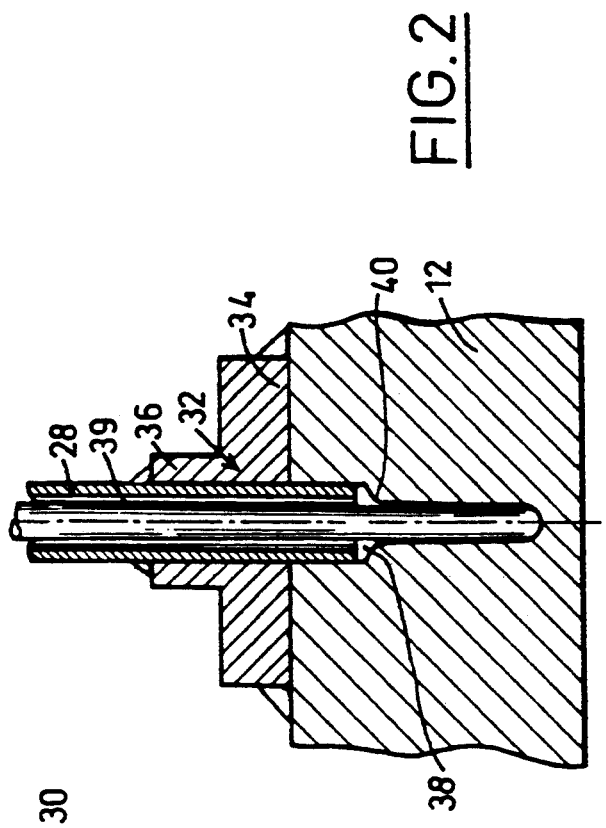
FIG.1
FIG.2

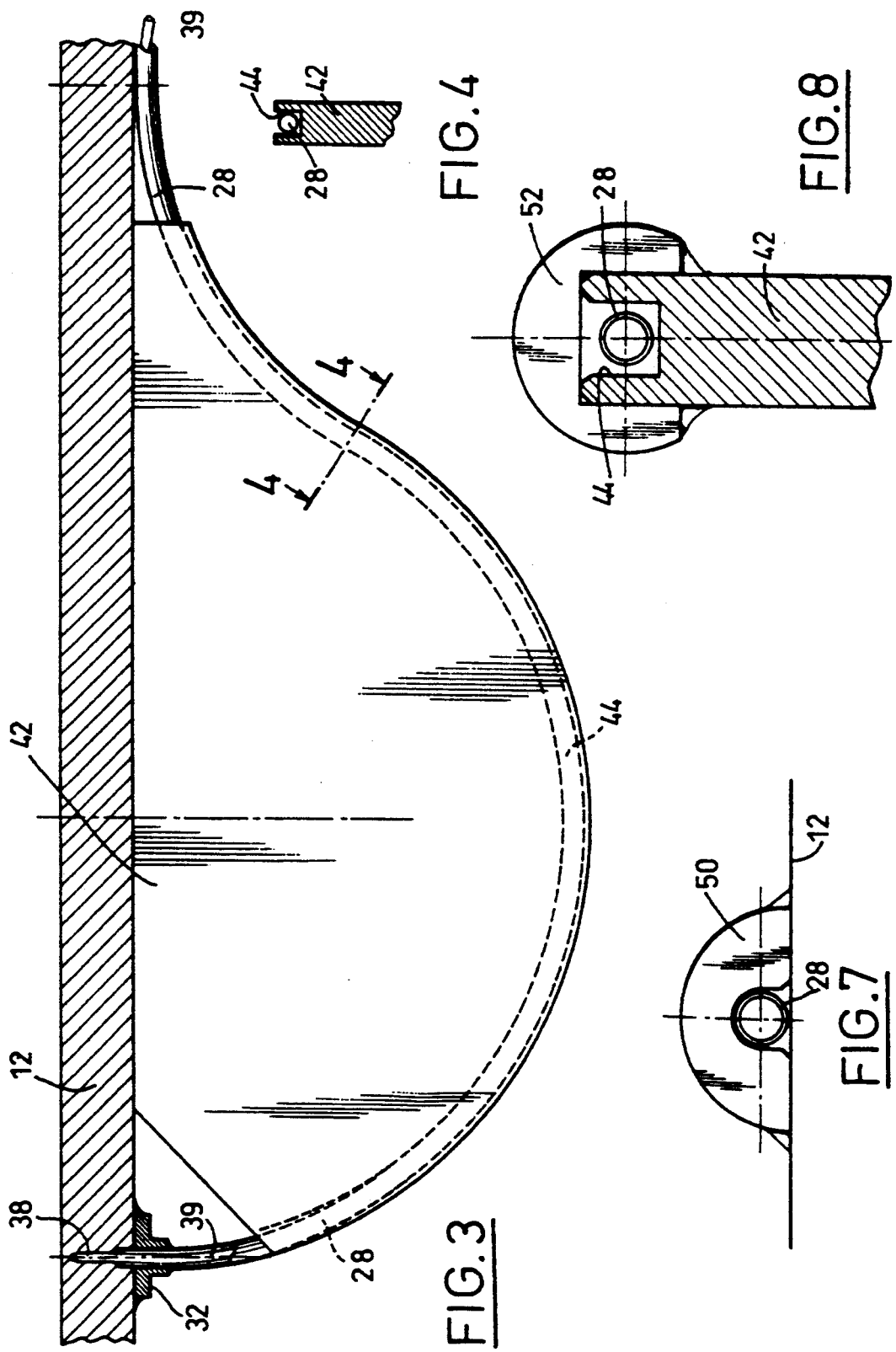

ROLLER FOR SUPPORTING OR DRIVING FLAT PRODUCTS, IN PARTICULAR FOR A CONTINUOUS TREATING INSTALLATION

BACKGROUND OF THE INVENTION

1. Field of the Invention

The present invention relates to a roller for supporting or driving flat products or sheets, in particular for a continuous treating installation.

In the course of the manufacture of the sheet, the latter is heat treated in a continuous annealing furnace after the rolling operations. The furnace, which has a length which may be as much as or even exceed 130 m, suitably heats the sheet passing through the furnace. This sheet is driven inside the furnace by hollow rollers. At the end of or during the heating, a little before the exit of the furnace, there is provided in the latter a device for measuring the temperature of the sheet for controlling the heating of the furnace.

2. Discussion of the Related Art

It is known to take the temperature of the sheet by means of a thermocouple disposed in a hollow driving roller placed inside the furnace. For this purpose, it is known to place the hot junction of the thermocouple in a blind hole in a block of material identical to that of the roller and to fix this block, by force or by soldering or welding in an opening provided through the wall of the roller in a region where its outer surface cooperates with the sheet by contact. In this way, the hot junction of the thermocouple is fixed in a block embedded in a wall of the roller in the vicinity of the outer surface of the roller. The remaining part of the thermocouple comprising the wires of the latter extends inside the roller The small thickness of material separating the hot junction of the thermocouple from the sheet permits assimilating the temperature taken by the thermocouple to that of the sheet.

However, when the roller has been assembled and placed in position in the furnace, it is impossible for an operator to have access to the interior of the roller. Consequently, in the event of failure of the thermocouple, as the latter is fixed inside the roller, it cannot be replaced without dismantling the roller.

Further, the opening cut in the wall of the roller and the fixing of the block of material containing the hot junction of the thermocouple in the opening create in this wall stresses which may form cracks and defects on the outer surface of the roller.

SUMMARY OF THE INVENTION

An object of the invention is to determine in a precise manner the temperature of the sheet manufactured in the course of a continuous treating process by means of a thermocouple disposed inside a roller driving the sheet, with the possibility of moving and replacing this thermocouple without dismantling the roller.

For this purpose, the invention provides a roller of the type comprising a hollow cylindrical body whose outer surface cooperates by contact with the sheet, and at least one thermocouple disposed inside the cylindrical body and having an end or hot junction which is disposed in the wall of the cylindrical body in the vicinity of said outer surface, characterized in that said thermocouple removably extends through a guide tube which extends inside the hollow cylindrical body and having an end which opens onto a blind hole provided in the wall of the cylindrical body and providing a cavity for the hot junction.

According to other features of the invention:

the end of the guide tube through which the hot junction extends is fixed to the inner surface of the cylindrical body by a connector having a first end or base soldered or welded to the inner surface of the cylindrical body and a second end or spigot soldered or welded to the guide tube;

the characteristics of expansion of the material of the connector are substantially equivalent to those of the material of the cylindrical body;

the end of the guide tube through which the hot junction extends and the blind hole forming a cavity for the hot junction are substantially perpendicular to the wall of the hollow cylindrical body;

the guide tube is mounted inside the roller with clearance in the supports and staples connected to the roller;

the thermocouple is connected to means for converting the signal delivered by the latter and connected to the roller;

the converting means comprise, for each thermocouple, a converter converting the voltage signal; delivered by the thermocouple into a stabilized signal;

a connector is interposed between the thermocouple and the signal converting means;

the output signal delivered by the converting means is transmitted to an electric circuit which is fixed relative to the roller by means comprising slip rings and collectors;

the signal delivered by the converting means is transmitted to a recording apparatus incorporated in the roller, the data of which are read during stoppages of the roller;

the roller comprises air cooling means for the converting means;

the converting means are disposed inside a case and said cooling means comprise a cooling air inlet port provided in the wall of the case and annular frames and supports, in the vicinity of the axis of which the converting means are fixed, which define a path for the circulation of the air in the case;

sealing means seal off the gases contained in the hollow cylindrical body from the converting means.

The invention also provides an annealing furnace for the continuous treatment of flat products or sheets employing at least one roller according to the invention.

BRIEF DESCRIPTION OF THE DRAWINGS

An embodiment of the invention will now be described hereinafter with reference to the accompanying drawings in which:

FIG. 1 is a partial diagrammatic longitudinal sectional view of a sheet-driving roller;

FIG. 2 is a detail sectional view of the part of FIG. 1 delimited by dot-dash lines and designated by the reference numeral 2;

FIG. 3 is a detail view of FIG. 1 showing a first support of a guide tube;

FIG. 4 ia a sectional view taken on line 4—4 of FIG. 3;

FIG. 7 is a cross-sectional view of the guide tube disposed in a staple;

FIG. 8 is a cross-sectional view of the guide tube disposed in a support and a staple.

DESCRIPTION OF THE PREFERRED EMBODIMENTS

Figure 5:
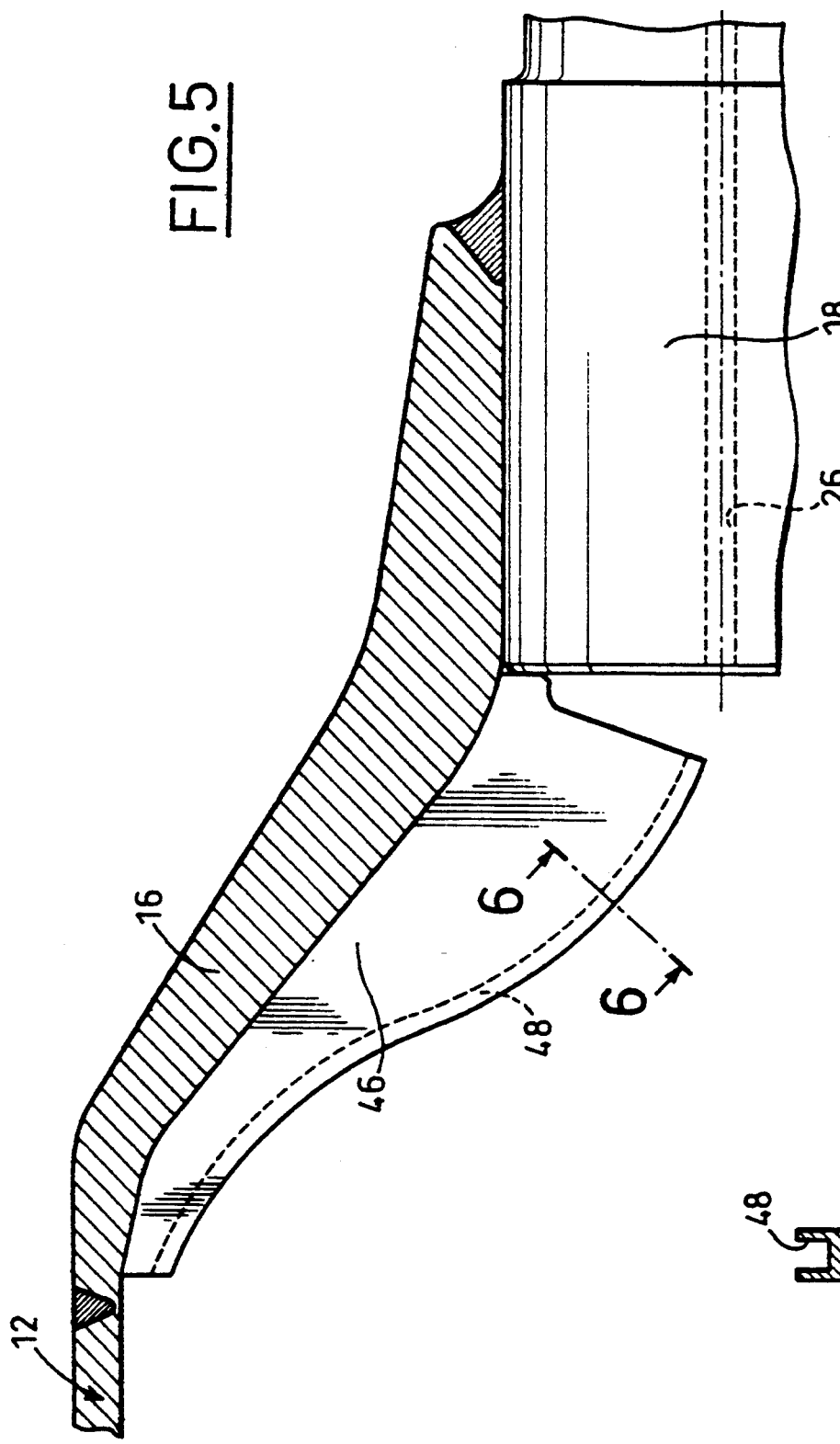
FIG. 5 is a detail view of FIG. 1 showing a second support of the guide tube.

FIG. 1 shows a sheet-driving roller 10 employed in an annealing furnace of a continuous treatment installation. This roller 10 comprises a hollow cylindrical body 12 including a straight cylinder 14 having opposite ends respectively closed by two plugs 16 defining a neck. Owing to the symmetry arrangement, only one of the plugs 16 is shown, namely that placed at the right end of the cylinder 14 as viewed in FIG. 1. The cylinder 14 has, in the presently-described embodiment, a length of 1,800 mm, a diameter of 600 mm and a wall 20 mm thick. The outer surface of the wall of the cylinder cooperates with the sheet by contact. The plugs 16 are respectively welded to each end of the cylinder 14 in the region of their largest diameter and comprise a shaft 10 which is mounted in the end of the respective plug 16 in the region of the smallest diameter of the plug. The plugs 16 extend through a wall 20 defining the enclosure of the furnace The bearings carrying the shafts 18 and the means for controlling and driving the roller are located outside the furnace and are not shown in the Figures. Ports 22 extending in a direction roughly perpendicular to the walls of each plug put the interior of the hollow cylinder 12 in communication with the atmosphere of the furnace for homogeneizing the hot gases in the roller 10 and in the furnace.

Figure 9:
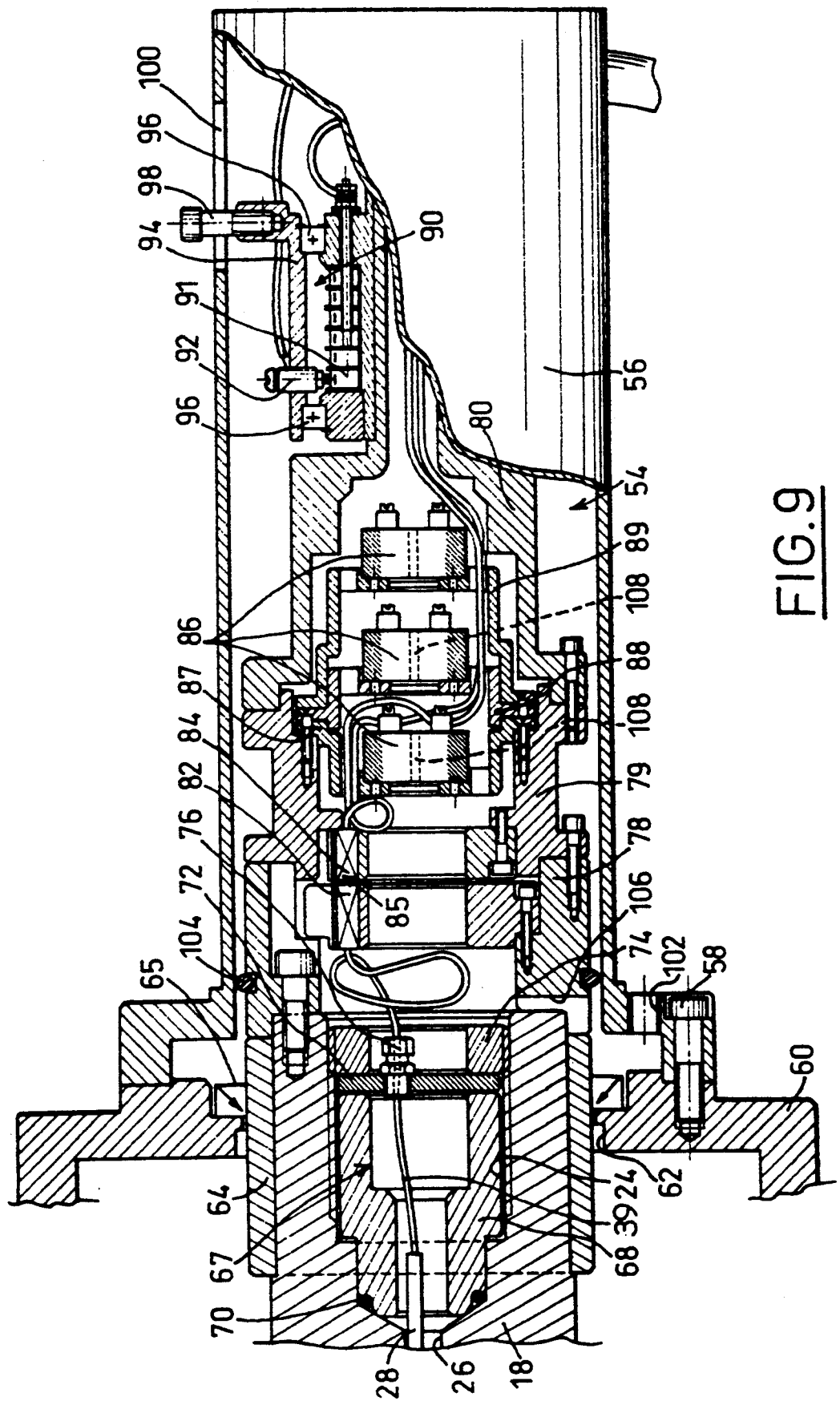
FIG. 9 is a partial longitudinal sectional view of an electromechanical device disposed at one end of the roller.

The shaft 18 shown in FIG. 1 is stepped and defines cylindrical portions whose diameters decrease in the direction of the free end of the shaft. The free end of the shaft includes a stepped axial bore 24 and an electromechanical device which is shown in FIG. 9 and will be described hereinafter.

Extending through the shaft 18 on the axis of the latter is a conduit 26 in which is partly disposed a guide tube 28 adapted to receive a temperature sensor, namely a thermocouple. The guide tube 28 extends from the stepped bore 24 of the shaft 18 to the wall of the cylindrical body 12 where it is fixed roughly in the region of the median transverse plane 30 of the roller shown in dot-dash lines in FIG. 1. In the presently-described embodiment, the guide tube 28 is of stainless steel. It has a diameter of 6 mm and its wall has a thickness of 1 mm. The means for positioning the guide rube inside the cylindrical body 12 will be described in more detail hereinafter.

FIG. 2 shows how the end of the guide tube 20 is fixed to be perpendicular to the wall of the cylindrical body 12 by a connector 32. This connector has a generally cylindrical shape and consists of two cylindrical portions 34, 36, one of which is of large diameter and is termed a base 34 welded to the inner surface of the cylindrical body 12, whereas the other is of small diameter and is termed a spigot 36 which is welded to the guide tube 28. The connector 32 is preferably composed of a material having the same coefficient of expansion as the wall of the cylindrical body 12 so as to optimise the strength of the fixing of this connector to the wall of the cylindrical body 12 and avoid in this wall the creation of stresses which would otherwise result from differential expansions.

The end of the guide tube 28 extends through the connector 32 and opens onto a blind hoe 38 provided in the wall of the cylindrical body 12 in a position perpendicular to this wall. In the illustrated embodiment, the inner end of the blind hole 38 is at 3 mm from the outer surface of the cylindrical body 12. However, this distance may be reduced to 1 mm by employing an apparatus capable of precisely measuring thickness for the machining of the blind hole. With reference to FIG. 2, it can be seen that the upper end of the blind hole 30 has an inside diameter adapted to receive the end of the guide tube 28, and the lower end of the blind hole has a smaller inside diameter less than the diameter of the guide tube 28 and is adapted to receive the end of a thermocouple 39 constituting the hot junction. A shoulder 40 which constitutes the boundary between the two parts of the blind hole 38 whose inside diameters are different has a rounded shape to facilitate placing the end of the thermocouple in position in the inner end of the blind hole 38 and avoid initiating any fracture.

FIGS. 3 to 8 show in more detail the mounting of the guide tube inside the roller 10. FIG. 3 shows how the guide tube 28 is positioned in the cylindrical body 12 by means of a first support 42 in the form of a plate. This support 42 is disposed in a longitudinal plane of the hollow cylindrical body 12 and is fixed by a longitudinal edge to the inner surface of the hollow cylindrical body 12. A groove 44 is provided in the free edge of the support 42. The section of the groove 44 is shown in FIG. 4. The width and depth of the groove 44 are adapted to receive the guide tube 28 with clearance. The contour of the edge of the support 42 in which the groove 44 is provided defines curved shapes which give predetermined orientations to the guide tube 28. Thus, as viewed in FIG. 3, the end of the guide tube extends out of the groove 44 on the left side of the support 42 in a direction perpendicular to the wall of the cylindrical body 12. Likewise, the guide tube 28 extends out of the groove 44 on the right side of the support 42 in a direction roughly parallel to the wall of the cylindrical body 12.

Figure 6:
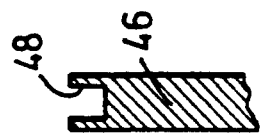
FIG. 6 is a sectional view taken on line 6—6 of FIG. 5.

Shown in FIG. 5 is a second support 46 for the guide tube 28, in the form of a plate which is contained, as the foregoing plate, in a longitudinal plane of the cylindrical body 12. This support 46 is fixed by an edge to the inner surface of the plug 16 of the cylindrical body 12. As for the previously-described support 44, a groove 48 is provided in the free edge of the support 46. The section of the groove 48 is shown in FIG. 6. The contour of the edge of the support 46 defines curved shapes whereby predetermined orientations may be given to the guide tube 28 which is received in the groove 48 without clearance. Thus, with reference to FIG. 5, although the guide tube 28 is not shown in this Figure, it will be understood that, on the left side of the support 46, the guide tube 28 extends out of the groove 48 and is roughly parallel to the wall of the cylindrical body 12, and, on the right side of the support 46, the guide tube 28 extends out of the groove 48 and is roughly on the axis of the conduit 26 of the shaft 18.

As already seen in FIG. 1, the guide tube 28 extends between the two supports 42, 46 alongside the wall of the cylindrical body 12. FIG. 7 shows one of the staples 50, termed short-branch staples, maintaining the guide tube 28 against the wall of the cylindrical body 12 between the two supports 42, 46. These staples 50 are fixed to the inner surface of the wall of the cylindrical body 12 by welding. The guide tube 28 is maintained closely between the staple 50 and the inner surface of the wall of the cylindrical body 12.

Shown in FIG. 8 is one of the staples 52, termed long-branch staples, disposed in a transverse position with respect to the groove 44 of the support 42. Long-branch staples 52 are also disposed on the support 46 in a manner similar to that shown in FIG. 8. It can be seen that, in distinction to the short-branch staples 50 shown in FIG. 7, the long-branch staples 52 maintain the guide tube 28 in the groove 44 with clearance. The guide tube 28 is therefore maintained with clearance between the walls of the grooves 44, 48 and the staples 52 to permit small displacements of the guide tube due to its expansion.

The thermocouple is disposed inside the roller 10 by passing it through the guide tube 28 when the roller has been placed in position in the furnace. However, the machining of the blind hole 38 where the hot junction of the thermocouple is received, and the fixing of the guide tube 28 inside the cylindrical body 12 must be carried out before fixing together the various elements constituting the roller 10, in particular the straight cylinder 14, the end plugs 16 and the shafts 18.

Only a single guide tube 28 is shown in the roller 10 in the Figures. However, it will be clear that other guide tubes 28 for thermocouples may also be placed in a similar manner in the roller 10. Preferably, three thermocouples are placed in the roller 10 and disposed respectively in three guide tubes 28. This permits dynamically balancing the roller 10 which is driven in rotation. The hot junctions of the thermocouples are for example disposed in the median transverse plane of the roller 10. However, they may also be disposed at any point of the wall of the roller.

When the roller 10 has been placed in position in the furnace, the thermocouple is passed through the guide tube 28 at the end of the latter which opens onto the stepped bore 24 of the shaft 18. The body of the thermocouple is urged so as to place the hot junction in position at the inner end of the blind hole 38 of the wall of the roller, at the other end of the guide tube 28.

FIG. 9 shows the end of the shaft 18 on which there is fixed an electromechanical device 54 connected to the thermocouple. The device 54 is disposed inside a case 56 fixed by screws 58 to a cover 60 connected to a fixed bearing (not shown) carrying the shaft 18. The end of this shaft 18 extends through the cover 60 in the region of an axial opening 62 in this cover. A wearing ring 64 is fitted on the end of the shaft 18 in the region of the opening 62 of the cover 60. A lip sealing element 65 provides a seal between the wearing ring 64 and the cover 60.

FIG. 9 shows a single guide tube 28 extending out of the conduit 26 in the stepped bore 24 and a single thermocouple 39 disposed in the guide tube 28. The thermocouple 39 is for example of the Chromel Alumel type. As already mentioned, preferably three thermocouples and therefore three guide tubes 28 are provided in the roller 10. They are assembled in a manner similar to that described hereinbefore.

As already seen in FIG. 1, the conduit 26 puts the interior of the hollow cylinder 12 in communication with the stepped bore 24. Consequently, the hot gases which are inside the cylindrical body 12 can reach the stepped bore 24 via the conduit 26. Sealing means 67 seal off the electromechanical device 54 from the hot gases contained in the furnace and the roller 10. These sealing means 67 comprise an annular spacer member 68 disposed in the stepped bore 24, an O-ring seal 70 located between the inner end of the stepped bore 24 and a first end of the spacer member 68, and a sealing disc 72 disposed between the second end of the spacer member 68 and a clamping nut 74 screwed in the stepped bore 24. The thermocouple 39 is passed through an adjustable connector 76 extending through the sealing disc 72. The thermocouple 39 is jammed in the connector 76 which thus maintains it in a position extending into the guide tube 28.

The electromechanical device 54 will now be described. This device comprises an assembly of annular supports 78, 79, 80 which are in juxtaposed relation and fixed to the shaft 18 by screws. The supports 78, 79 close to the shaft 18 respectively comprise two complementary elements 82, 84 of a miniature connector 85, for example of the type manufactured by the firm Thermo Electric under the reference CNN-21 200.KX. The connector element 82 is connected to the thermocouple 39. The connector element 84 is connected to means for converting the signal delivered by the thermocouple, namely a converter 86. The function of the converter 86 will be subsequently explained. It can be seen in FIG. 9 that the electromechanical device 54 includes two other identical converters 86 for two other thermocouples, the electric connecting wires and the corresponding connectors of which have not been shown The three converters 86 are respectively disposed on annular frames 87, 88, 89 fixed to the support 79 by screws. The converters 86 are placed on the axis of the annular frames.

The output of the converters 86 is connected to a device 90 comprising slip rings 91 and collectors or brushes 92 of known type. The rings 91 are fixed to the support 80 which is secured to the shaft 18. The collectors 92, only one of which is shown in FIG. 9, are fixed to a support 94 carried by ball bearings 96 arranged between the support 94 and the ring support 80. The collector support 94 is prevented from rotating by a screw 98 which is screwed into the latter and has a stem portion extending through an oblong slot 100 in the case 56. This slot 100 allows the fixing screw 98 to travel in a direction parallel to the axis of the roller 10 as a result of expansion of the latter.

The converters 86 convert the voltage signals (0 to 18 mV) delivered by the thermocouples, before their transmission through the ring and collector device 90, into stabilized currents whose magnitude is solely dependent on the magnitudes of said voltages and are consequently independent of any variations in resistance (line resistances or contact resistances) of the output circuits of the converters. In the presently-described embodiment, the outputs of the converters deliver a current of between 4 and 20 mA linearly corresponding to temperatures of 0° to 1,000° C. In this way, the output current of the converters is insensitive to electric pollutions created by the contacts between the rings and the collectors. The ring-collector devices may consequently be of ordinary construction with no necessity to use an assembly of sophisticated and consequently costly collectors. Precise temperature measurements are in this way obtained. Further, the outputs of the converters at 4 to 20 mA are standardized and consequently data delivered by the thermocouples can be sent to a standard system receiving and processing numerical data for regulating the furnace.

Owing to the use of the connector 85 connected to each thermocouple 39, the assembly comprising the converters 86 and the ring and collector device 90 is easily dismantled without having to move the thermocouples 39 relative to the roller 10.

It is possible to eliminate the ring/collector device 90 and to receive the signal delivered by the sensors 39 in a recording apparatus (not shown in the drawings) combined with the roller. The recorded data are read on the recording apparatus during stoppages of the roller.

The means for cooling the electromechanical device 54, in particular the converters 86 whose operation requires moderate temperatures, will now be described. A port 102 provided in the case 56 in the vicinity of the end of the shaft 18 provides a cooling air inlet. The air is brought to this air inlet port 102 by a supply device of known type (not shown in the drawings). In the case 56, the air is channelled by an annular sealing element 104 disposed between the support 78 and the case 56, to a radial duct 106 provided in the connector support 78. The annular shapes of the supports 78, 79, 80 and the converter frames 87, 88, 89 ensure a circulation of cooling air in a substantially axial path in the case 56. The cooling of the converters 86 optimized by throughway axially extending passages 108 provided in the converters.

To replace a thermocouple, it is sufficient to dismantle the case 56 and the electromechanical device 54, then extract the thermocouple by pulling on the latter at the connector 76. Another thermocouple can be placed in position by passing the latter through the connector 76 and through the guide tube 28 one end of which is in the vicinity of the connector 76.

What is claimed is:

1. A roller for supporting and/or driving flat products or sheets for a continuous treatment thereof, said roller comprising a hollow cylindrical body having a wall defining an inner surface and an outer surface which is cooperative by contact with said flat products or sheets, and at least one thermocouple disposed inside said cylindrical body, a blind hole provided in said wall of said cylindrical body and forming a cavity, a guide tube extending inside said hollow cylindrical body and having an end which opens onto said blind hole and which is fixed to said wall of the cylindrical body, said at least one thermocouple having at one end a hot junction and removably extending through said guide tube with said hot junction extending out of said end of said guide tube and into said cavity so as to be in the vicinity of said outer surface.

2. The roller according to claim 1, comprising a connector for fixing said end of said guide tube to said surface of said wall of said cylindrical body, said connector having a first end soldered or welded to said inner surface and a second end soldered or welded to said guide tube.

3. The roller according to claim 2, wherein the characteristics of expansion of the material of said connector are substantially equivalent to the characteristics of expansion of the material of said cylindrical body.

4. The roller according to claim 1, wherein said end of said guide tube and said blind hole forming a cavity for said hot junction are substantially perpendicular to said wall of said hollow cylindrical body.

5. The roller according to claim 1, comprising supports and staples connected to said roller for mounting with clearance said guide tube inside said roller.

6. The roller according to claim 1, comprising means for converting the signal delivered by said at least one thermocouple connected to said at least one thermocouple and to said roller, and sealing means for sealing off gases contained in said hollow cylindrical body from said converting means.

* * * * *